United States Patent
Rigano

(10) Patent No.: US 9,548,447 B2
(45) Date of Patent: Jan. 17, 2017

(54) INTEGRATED MEMORY AND METHODS OF FORMING REPEATING STRUCTURES

(71) Applicant: Micron Technology, Inc., Boise, ID (US)

(72) Inventor: Antonino Rigano, Pioltello (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/927,316

(22) Filed: Oct. 29, 2015

(65) Prior Publication Data

US 2016/0064658 A1 Mar. 3, 2016

Related U.S. Application Data

(62) Division of application No. 14/250,114, filed on Apr. 10, 2014, now Pat. No. 9,203,025.

(51) Int. Cl.
| | |
|---|---|
| *H01L 29/06* | (2006.01) |
| *H01L 47/00* | (2006.01) |
| *H01L 45/00* | (2006.01) |
| *H01L 27/24* | (2006.01) |

(52) U.S. Cl.
CPC .......... *H01L 45/06* (2013.01); *H01L 27/2463* (2013.01); *H01L 45/124* (2013.01); *H01L 45/126* (2013.01); *H01L 45/1233* (2013.01); *H01L 45/1286* (2013.01); *H01L 45/144* (2013.01); *H01L 45/16* (2013.01); *H01L 45/1675* (2013.01); *H01L 45/1691* (2013.01)

(58) Field of Classification Search
CPC .... H01L 27/2463; H01L 45/06; H01L 45/126; H01L 45/1286; H01L 45/144; H01L 45/1233
See application file for complete search history.

(56) References Cited

U.S. PATENT DOCUMENTS

| | | | |
|---|---|---|---|
| 8,013,319 B2 | 9/2011 | Chang | |
| 8,468,692 B2 | 6/2013 | Kim | |
| 2008/0048293 A1 | 2/2008 | Horii | |
| 2010/0227438 A1* | 9/2010 | Ha | G11C 13/0004 438/129 |
| 2013/0099190 A1* | 4/2013 | Oh | H01L 27/2409 257/4 |

(Continued)

Primary Examiner — Jesse Y Miyoshi
(74) Attorney, Agent, or Firm — Wells St. John, P.S.

(57) ABSTRACT

Some embodiments include integrated memory having an array of repeating plates across a plurality of nodes. The array includes rows and columns. The plates along individual columns and individual rows alternate between two orientations which are substantially orthogonal to one another. Some embodiments include methods of forming repeating structures. A pattern is formed which includes a lattice of intersecting wavy lines and a box surrounding the lattice. The pattern has a plurality of openings extending therethrough. A liner material is along sidewalls of the openings. The liner material and the pattern are sliced along a row direction and a column direction substantially orthogonal to the row direction. Such slicing subdivides the liner material into a plurality of plates. The plates are within an array comprising columns and rows. The plates along individual columns and individual rows alternate between two orientations which are substantially orthogonal to one another.

10 Claims, 13 Drawing Sheets

(56) References Cited

U.S. PATENT DOCUMENTS

| | | |
|---|---|---|
| 2013/0126812 A1 | 5/2013 | Redaelli et al. |
| 2013/0187120 A1 | 7/2013 | Redaelli |
| 2013/0343119 A1 | 12/2013 | Redaelli |
| 2015/0295173 A1 | 10/2015 | Rigano |

* cited by examiner

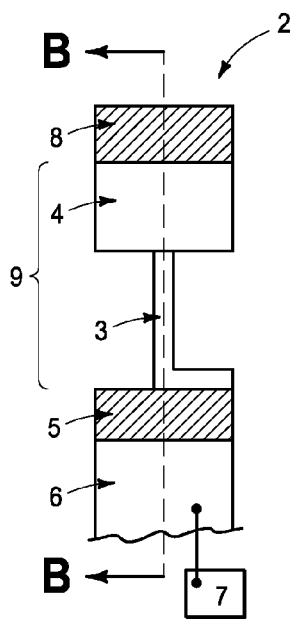
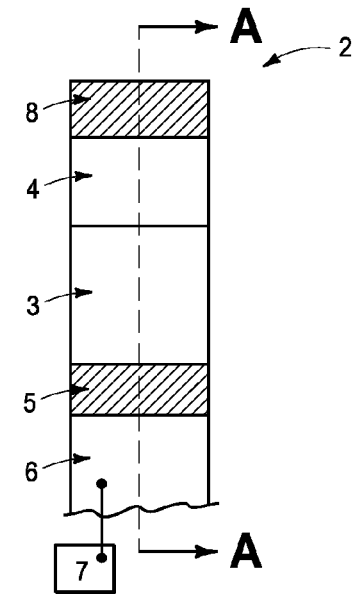
FIG. 1A
PRIOR ART
FIG. 1B
PRIOR ART
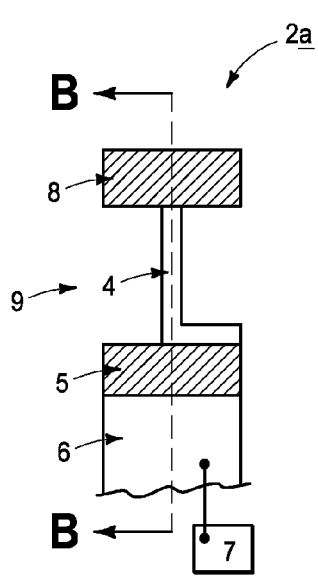
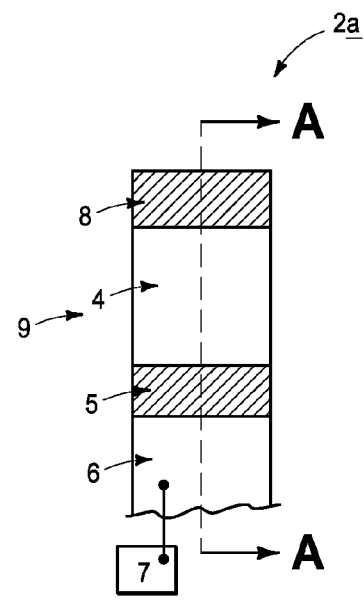
FIG. 2A
PRIOR ART
FIG. 2B
PRIOR ART

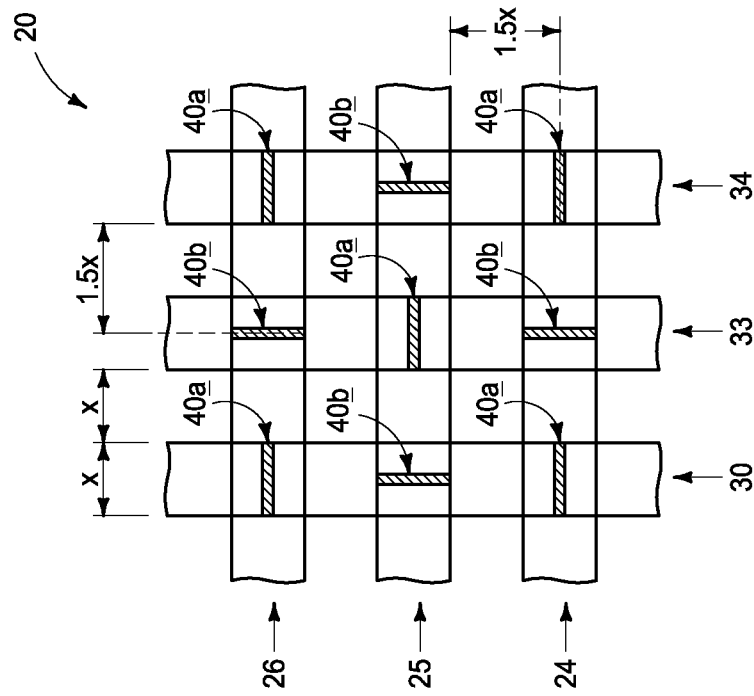
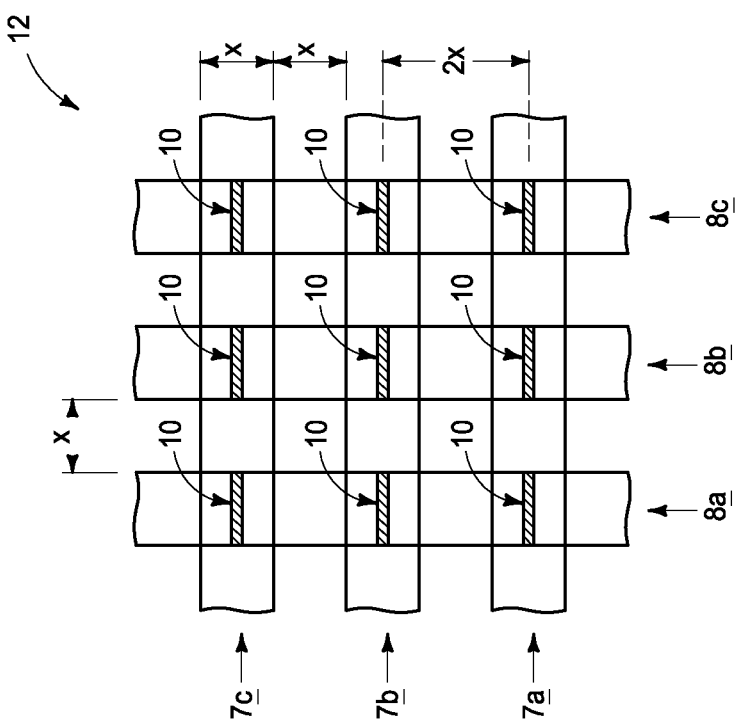
FIG. 5B
FIG. 5A
PRIOR ART

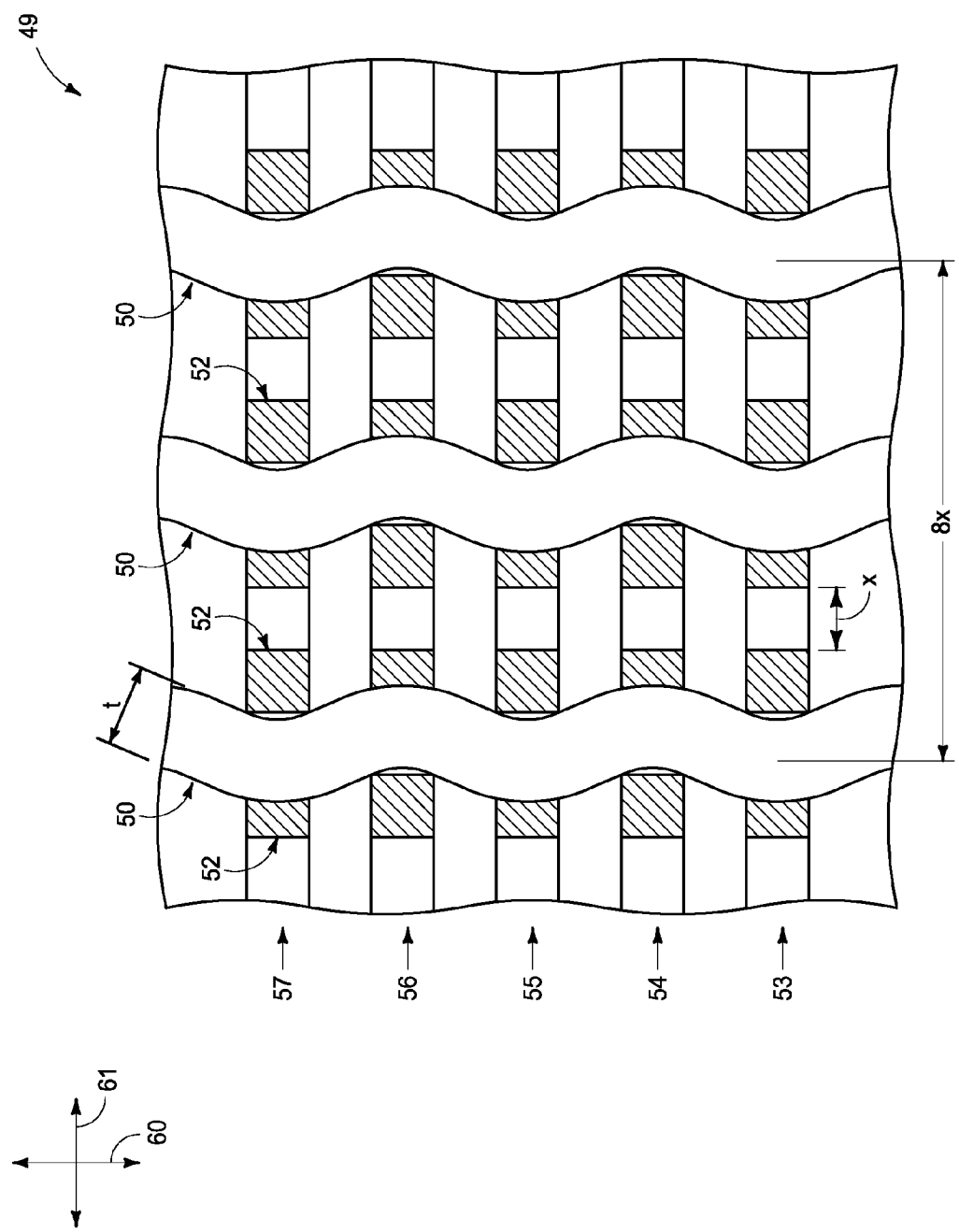

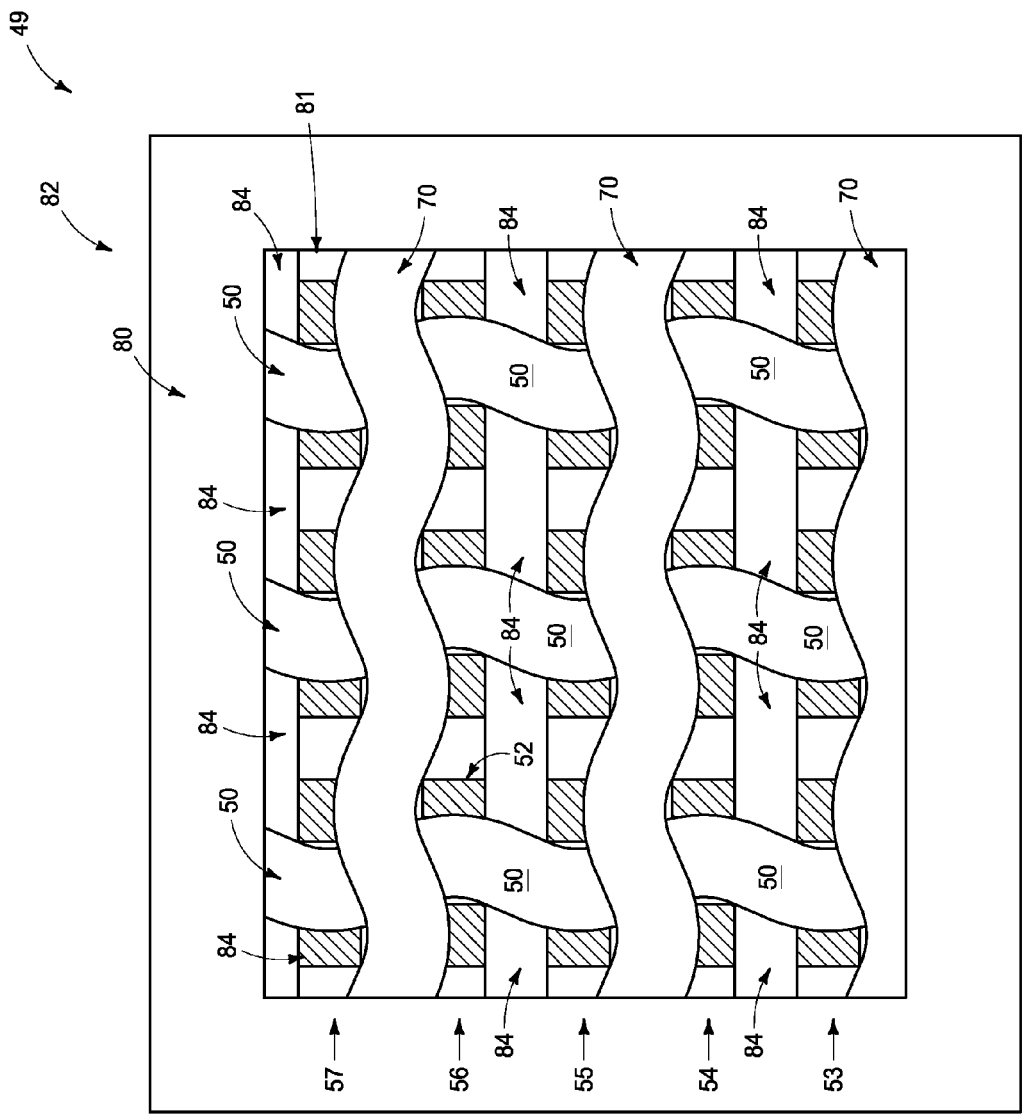
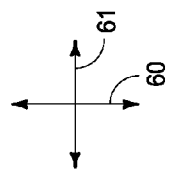
FIG. 8

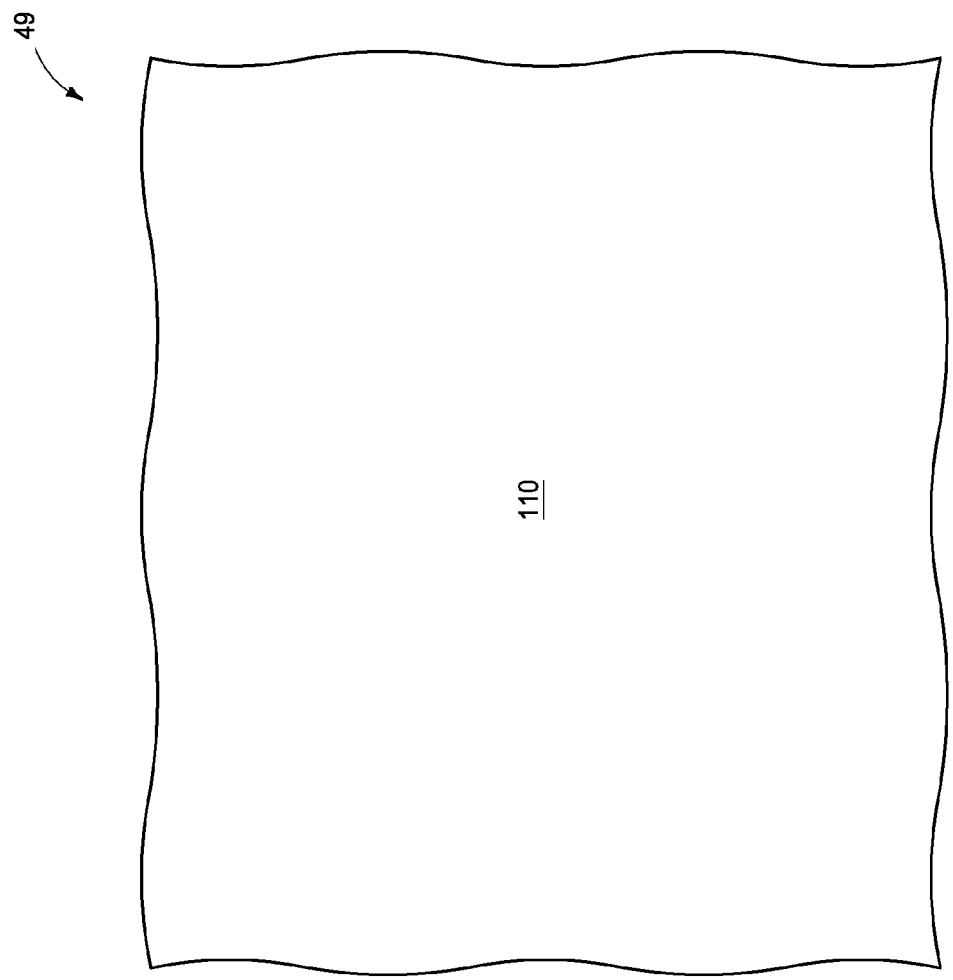
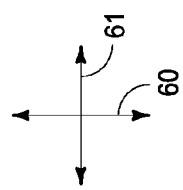
FIG. 11

INTEGRATED MEMORY AND METHODS OF FORMING REPEATING STRUCTURES

RELATED PATENT DATA

This patent resulted from a divisional of U.S. patent application Ser. No. 14/250,114, which was filed Apr. 10, 2014, and which is hereby incorporated herein by reference.

TECHNICAL FIELD

Integrated memory and methods of forming repeating structures.

BACKGROUND

Memory is one type of integrated circuitry and may be used in electronic systems for storing data. Integrated memory is usually fabricated in one or more arrays of individual memory cells.

The memory cells are configured to retain or store memory in at least two different selectable states. In a binary system, the states are considered as either a "0" or a "1". In other systems, at least some individual memory cells may be configured to store more than two levels or states of information.

One type of memory cell is phase change memory (PCM). Such memory utilizes phase change material as a programmable material. Example phase change materials that may be utilized in PCM are chalcogenide materials.

The phase change material reversibly transforms from one phase to another through application of appropriate stimulus. Each phase may be utilized as a memory state, and thus an individual PCM cell may have two selectable memory states that correspond to two inducible phases of the phase change material.

FIGS. 1 and 2 diagrammatically illustrate a couple of prior art memory structures. Specifically, FIGS. 1A and 1B illustrate a memory structure 2 utilizing a heater, and FIGS. 2A and 2B illustrate a memory structure 2a in a heaterless configuration.

The memory structure 2 of FIG. 1 is shown to comprise a heater plate 3 which is beneath and directly against a storage element 4 of phase change material (the phase change material may comprise, for example, chalcogenide material). The heater plate and the storage element are together comprised by a phase change memory cell 9, with the heater being utilized to induce a change in phase within the storage element (for instance, within chalcogenide) during programming of such memory cell.

The heater plate is over and directly against electrically conductive material 5 (which may be, for example, silicide), and the electrically conductive material 5 is over other materials 6 within a pedestal. The pedestal may include a select device (for instance, a bipolar transistor) which is coupled to the adjacent memory cell 9 to alleviate potential leakage problems.

A wordline 7 is beneath the memory cell, and a bitline 8 is above the memory cell. In operation, voltage differentials between the wordline and bitline are utilized for writing to, and reading from, the memory cell.

The heaterless memory structure 2a of FIG. 2 differs from the memory structure shown in FIG. 1 in that the cell 9 of FIG. 2 comprises the storage element 4 (for instance, chalcogenide) configured as a plate, and lacks the heater plate (i.e., the plate 3 of FIG. 1).

The memory cells 9 of FIGS. 1 and 2 may be incorporated into memory arrays. FIG. 3 shows a top view of an example prior art memory array 12. Wordlines 7a-d extend along the row directions of the array, and bitlines 8a-d extend along column directions of the array. Plates 10 (which may be either the heater plates of the FIG. 1 cell or chalcogenide plates of the FIG. 2 cell) are diagrammatically illustrated to be present at cross-points where wordlines and bitlines overlap. The plates would actually be over the wordlines and under the bitlines (as shown in the side views of FIGS. 1 and 2), and accordingly would not be visible in the top view of FIG. 3. However, the locations of the plates are shown in FIG. 3 in order to assist the reader in understanding the prior art pattern.

A difficulty that may be encountered during utilization of PCM is thermal cross-talk between adjacent memory cells. Specifically, the induction of a phase change within one memory cell may inadvertently trigger a change in a neighboring memory cell. The thermal crosstalk may cause a so-called "program-disturb" phenomena in which data is lost from a memory cell during programming of a neighboring memory cell, and may cause other problems, such as, for example, reducing the useful lifetime of memory cells within an array.

It would be desirable to alleviate or prevent thermal crosstalk between neighboring memory cells of PCM arrays.

BRIEF DESCRIPTION OF THE DRAWINGS

FIGS. 1A and 1B are diagrammatic cross-sectional views of a prior art memory device. The view of FIG. 1A is along the line A-A of FIG. 1B, and the view of FIG. 1B is along the line B-B of FIG. 1A.

FIGS. 2A and 2B are diagrammatic cross-sectional views of a prior art memory device. The view of FIG. 2A is along the line A-A of FIG. 2B, and the view of FIG. 2B is along the line B-B of FIG. 2A.

FIG. 5A is a diagrammatic top view of a prior art memory array, and FIG. 5B is a diagrammatic top view an example embodiment memory array.

FIGS. 6-12 are diagrammatic top views of a construction at various processing stages of an example embodiment method for fabricating an example embodiment memory array.

DETAILED DESCRIPTION OF THE ILLUSTRATED EMBODIMENTS

Some embodiments include new patterns of repeating plates which may alleviate or prevent the thermal crosstalk associated with conventional memory arrays, and some embodiments include methods of forming the new patterns.

Figure 3:
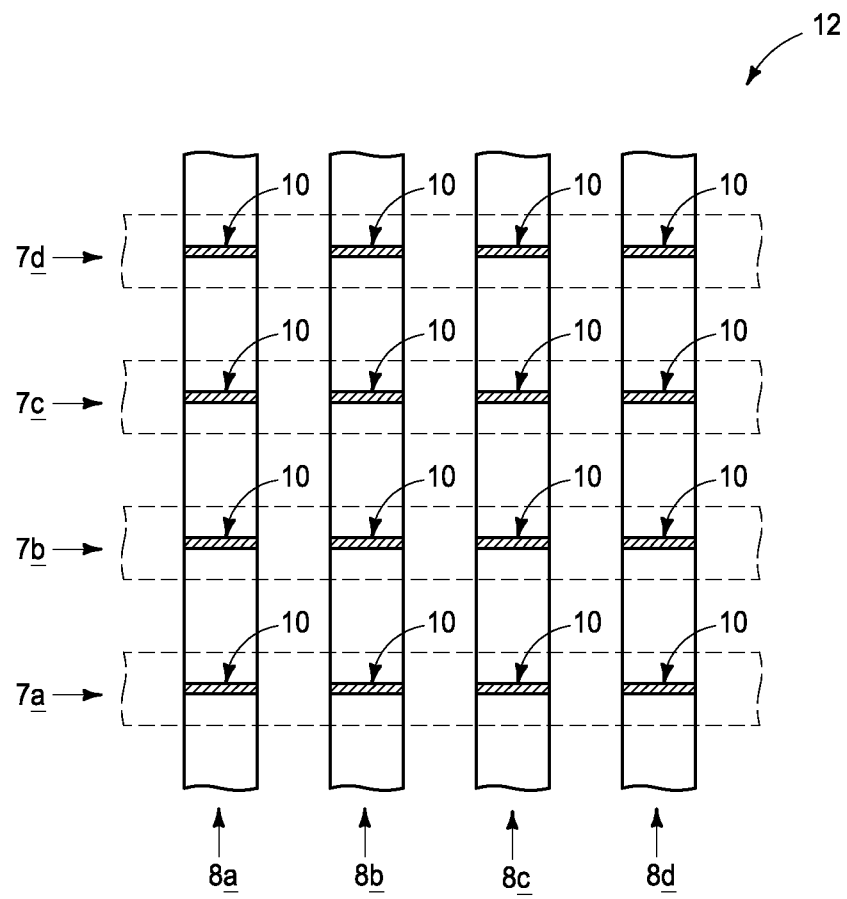
FIG. 3 is a diagrammatic top view of a prior art memory array.
Figure 4:
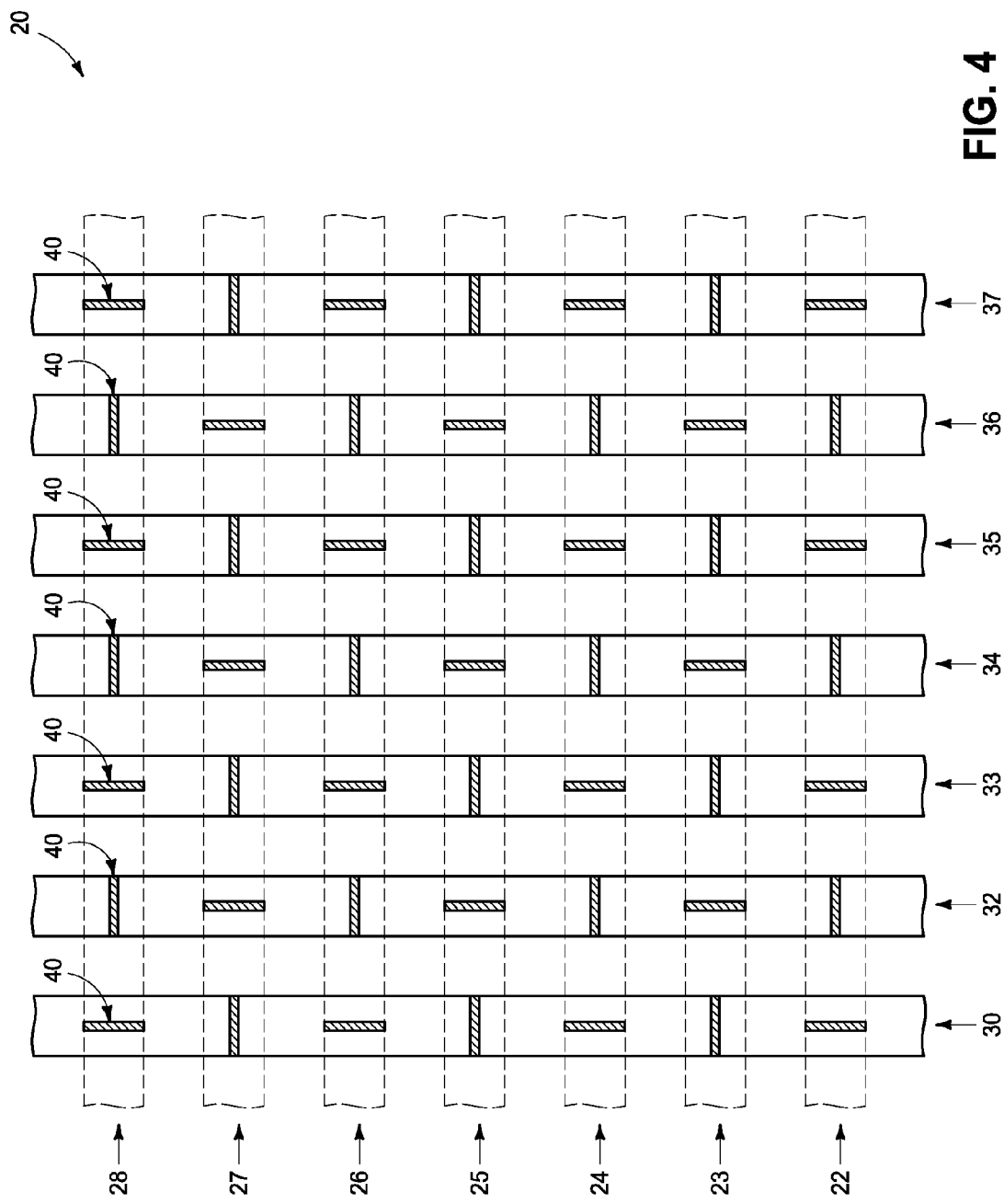
FIG. 4 is a diagrammatic top view of an example embodiment memory array.

FIG. 4 shows a top view of a memory array 20 comprising an example embodiment configuration. The memory array includes wordlines 22-28 extending along rows, and bitlines 30-37 extending along columns. Plates 40 (only some of which are labeled) are diagrammatically illustrated to be present at cross-points where wordlines and bitlines overlap. The plates may correspond to heater plates analogous to the plates 3 of FIG. 1, or to storage element plates analogous to the plates 4 of FIG. 2. The plates would actually be over the wordlines and under the bitlines (as described relative to the side views of prior art FIGS. 1 and 2), and accordingly would not be visible in the top view of FIG. 4. However, the locations of the plates 40 are shown in FIG. 4 in order to assist the reader in understanding a pattern of the plates. Specifically, the plates 40 are configured in a pattern in which plates along individual columns alternate between two orientations which are substantially orthogonal to one another, and plates along individual rows also alternate between such two orientations. The utilization of the two alternating orientations of plates 40 may alleviate or prevent crosstalk problems associated with conventional memory configurations.

FIG. 5 compares a portion of the prior art memory configuration 12 (FIG. 5A) with a portion of the example embodiment memory configuration 20 (FIG. 5B). The plates 10 of configuration 12 are all in a same orientation relative to one another, whereas the plates 40 of configuration 20 alternate between a configuration 40a and 40b. The configurations 40a and 40b are substantially orthogonal to one another; with the term "substantially orthogonal" indicating that the configurations are orthogonal to one another within reasonable tolerances of fabrication and measurement.

Distances between adjacent plates are different in the memory configuration 20 relative to the memory configuration 12. Specifically, if the wordlines and bitlines are fabricated at a feature size of about "x", then adjacent plates are separated by a center-to-center distance of about 2x along the column direction of the prior art configuration 12, and by an edge-to-edge distance of about x along the row direction. In contrast, the plates 40 are separated by a center-to-edge distance of about 1.5x along both the row direction and the column direction. Thus, a closest distance between adjacent cells is further in the embodiment of memory configuration 20 (with such closest distance being about 1.5x) than in the conventional memory configuration 12 (with such closest distance being about x), and yet the overall dimensions of the memory array remain about the same in the example embodiment configuration 20 relative to the prior art configuration 12.

The increased spacing between memory cells with the embodiments described herein relative to conventional configurations may enable such embodiments to reduce, or even eliminate, the problematic thermal crosstalk associated with conventional memory configurations. Reduction of thermal crosstalk may advantageously improve programming characteristics across the array of memory cells, and may also advantageously increase durability of the memory cells relative to a large number of write/erase cycles.

The dimension "1.5x" of the embodiment of FIG. 5B may be any suitable dimension, and in some embodiments may be within a range of from about 20 nm to about 60 nm (for instance, may be about 40 nm).

The plates 40 of FIGS. 4 and 5B may comprise any suitable material. For instance, if the plates correspond to heaters, they may comprise, for example, one or more of various heater material compositions containing metal and nitrogen (for instance, WN, TiN, WCN, TiAlN, TiSiN, etc.; where the listed formulas provide primary components rather than specifying specific stoichiometries). If the plates comprise phase change material, they may comprise chalcogenide; and in specific embodiments may comprise compositions containing germanium, antimony and tellurium (e.g., compositions referred to as GST). Although phase change materials (for instance, chalcogenide materials) are utilized as example materials of storage element materials in some of the embodiments described herein, the invention is not limited to storage elements comprising phase change materials. For instance, in some embodiments the storage elements may comprise variable resistance materials (e.g., polymer and/or binary metal oxide based resistive variable materials). In some embodiments, plate alignments described herein may provide advantages (for instance, reduction or elimination of cross-talk between neighboring memory cells) for storage elements comprising phase change materials and/or for storage elements comprising other materials besides phase change materials.

Configurations analogous to the example embodiment configuration 20 of FIGS. 4 and 5B may be formed with any suitable method. Example methods are described with reference to FIGS. 6-12.

Referring to FIG. 6, a construction 49 is illustrated at a processing stage after a first series of wavy lines 50 has been formed across an upper surface of a semiconductor substrate. The substrate may comprise various layers and structures associated with fabrication of a memory array; and for example may comprise a plurality of electrically conductive nodes 52 (only some of which are labeled) corresponding to conductive material 5 of FIGS. 1 and 2 patterned across a plurality of pedestals (with example pedestals being the types described in FIGS. 1 and 2). The conductive nodes are shown arranged along columns and rows of an array. Specifically, the columns extend along a direction of an axis 60, and the rows extend along a direction of an axis 61 which is substantially orthogonal to the axis 60.

The substrate supporting nodes 52 may comprise any suitable material; such as, for example, a monocrystalline silicon base material. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, semiconductor substrates.

Wordlines 53-57 are illustrated to extend along rows of the array under the nodes 52. The wordlines may comprise any suitable compositions and configurations.

The wavy lines 50 extend primarily along the column direction of axis 60.

The wavy lines 50 may comprise any suitable composition or combination of compositions; and in some embodiments may comprise, consist essentially of, or consist of silicon nitride.

The wavy lines 50 may be formed with any suitable processing. For instance, the wavy lines may be patterned utilizing a photolithographically-patterned mask (not shown), which may or may not be removed subsequent to the patterning of the lines 50. Alternatively, the wavy lines may be patterned utilizing a sublithographic mask; such as, for example, a mask fabricated with pitch-multiplication methodologies.

The nodes 52 are fabricated at a feature size of about "x", and in the shown embodiment a center-to-center distance between the outer two of the wavy lines 50 is about 8x. The wavy lines 50 have thickness "T" which may be greater than x, and in some embodiments may be from about 1.2x to about 1.5x.

Figure 7:
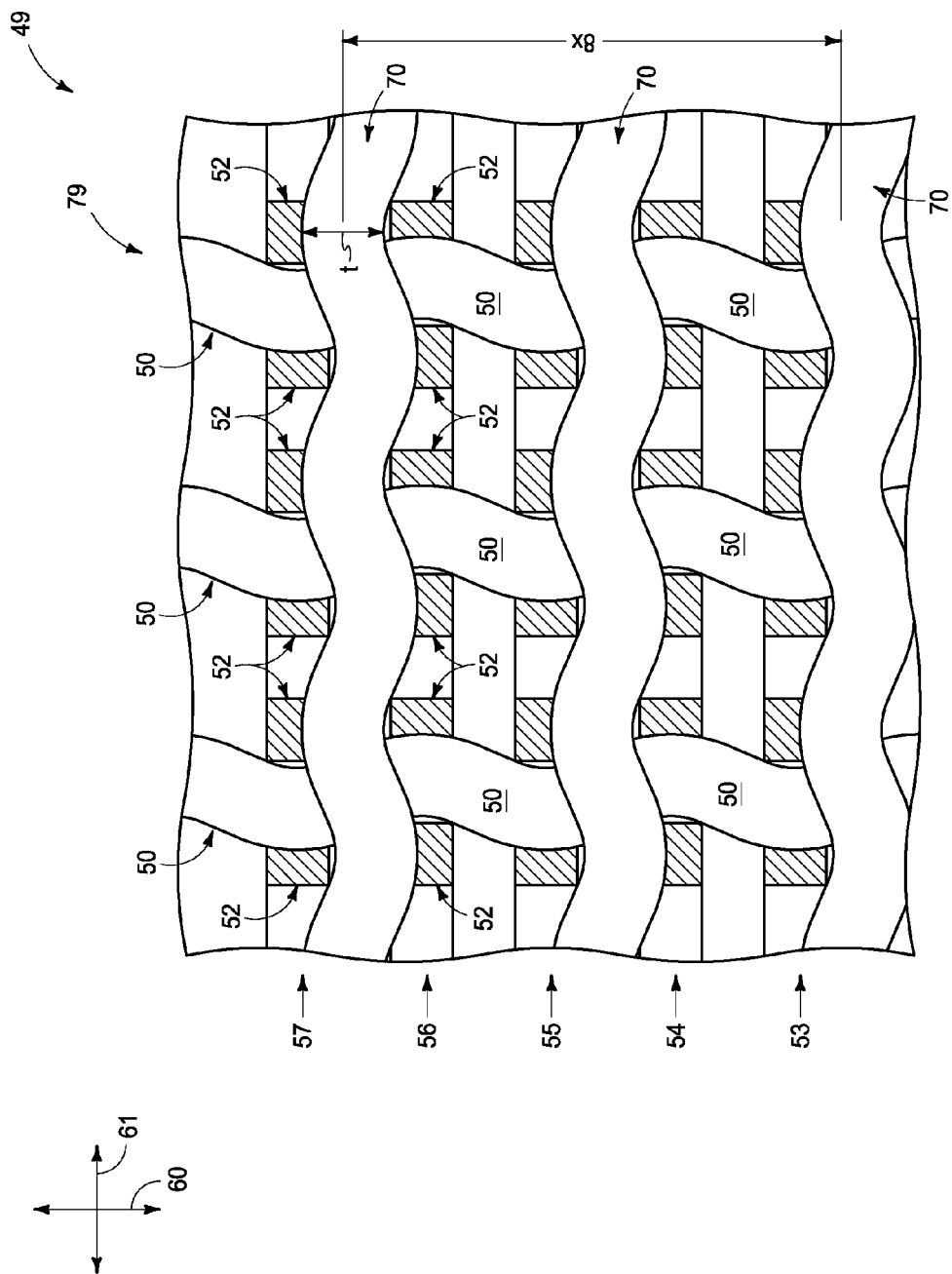

Referring to FIG. 7, a second series of wavy lines 70 is formed across the upper surface of the semiconductor substrate; with the wavy lines 70 extending primarily along the row direction of axis 61. The wavy lines 70 thus extend substantially orthogonally to the wavy lines 50 and overlap the wavy lines 50.

The wavy lines 70 may comprise any suitable composition or combination of compositions, and may comprise the same composition as wavy lines 50 or a different composition. In some embodiments, wavy lines 70 may comprise, consist essentially of, or consist of silicon nitride.

The wavy lines 70 may be formed with any suitable processing, including, for example, photolithographic processing or sublithographic processing.

In the shown embodiment, the wavy lines 70 are fabricated at the same thickness as the wavy lines 50, and are on a same pitch as the wavy lines 50.

The wavy lines 70 and wavy lines 50 together form a lattice 79 across the underlying substrate, and each of the nodes 52 is partially covered by one of the wavy lines of such lattice. In some embodiments, the lattice 79 may be considered to correspond to a pattern of wavy lines 70 intersecting with a pattern of wavy lines 50.

Although the wavy lines 70 along the row direction are described as being fabricated subsequent to the wavy lines 50 along the column direction, in other embodiments the order of fabrication may be reversed so that the wavy lines 70 are formed prior to the wavy lines 50. In yet other embodiments, the lattice pattern comprising the combined wavy lines 50 and 70 may be formed in a single fabrication step, rather than being formed by two overlapping series of wavy lines.

Referring to FIG. 8, a box 80 is formed around the lattice of wavy lines 50 and 70. Although the box is shown formed entirely around the illustrated region of the lattice, it is to be understood that the lattice may extend across a much larger portion of a substrate than is illustrated, and the box 80 may be one of numerous boxes formed across regions of the lattice. The box 80 surrounds the illustrated region of the lattice to thereby box-in such region. Accordingly, in some embodiments the region surrounded by box 80 may be referred to as a boxed-in region 81.

Box 80 may comprise any suitable composition or combination of compositions, and may comprise a common composition as wavy lines 70 and/or wavy lines 50. In some embodiments, box 80 may comprise, consist essentially of, or consist of silicon nitride. The box 80 may be formed with any suitable processing, including, for example, photolithographic processing or sublithographic processing. Although box 80 is shown being formed subsequent to wavy lines 50 and 70, in other embodiments the box may be formed prior to the wavy lines 50 and/or the wavy lines 70. In yet other embodiments, a pattern corresponding to box 80 in combination with wavy lines 50 and 70 may be formed in a single processing step, instead of utilizing the separate processing steps of FIGS. 6-8.

In the shown embodiment, the boxed-in region 81 comprises only three wavy lines 50 of the first series, and only three wavy lines 70 of the second series.

The box 80, together with wavy lines 50 and 70, forms a pattern 82. A plurality of openings 84 extends through such pattern to expose regions of nodes 52.

Figure 9:
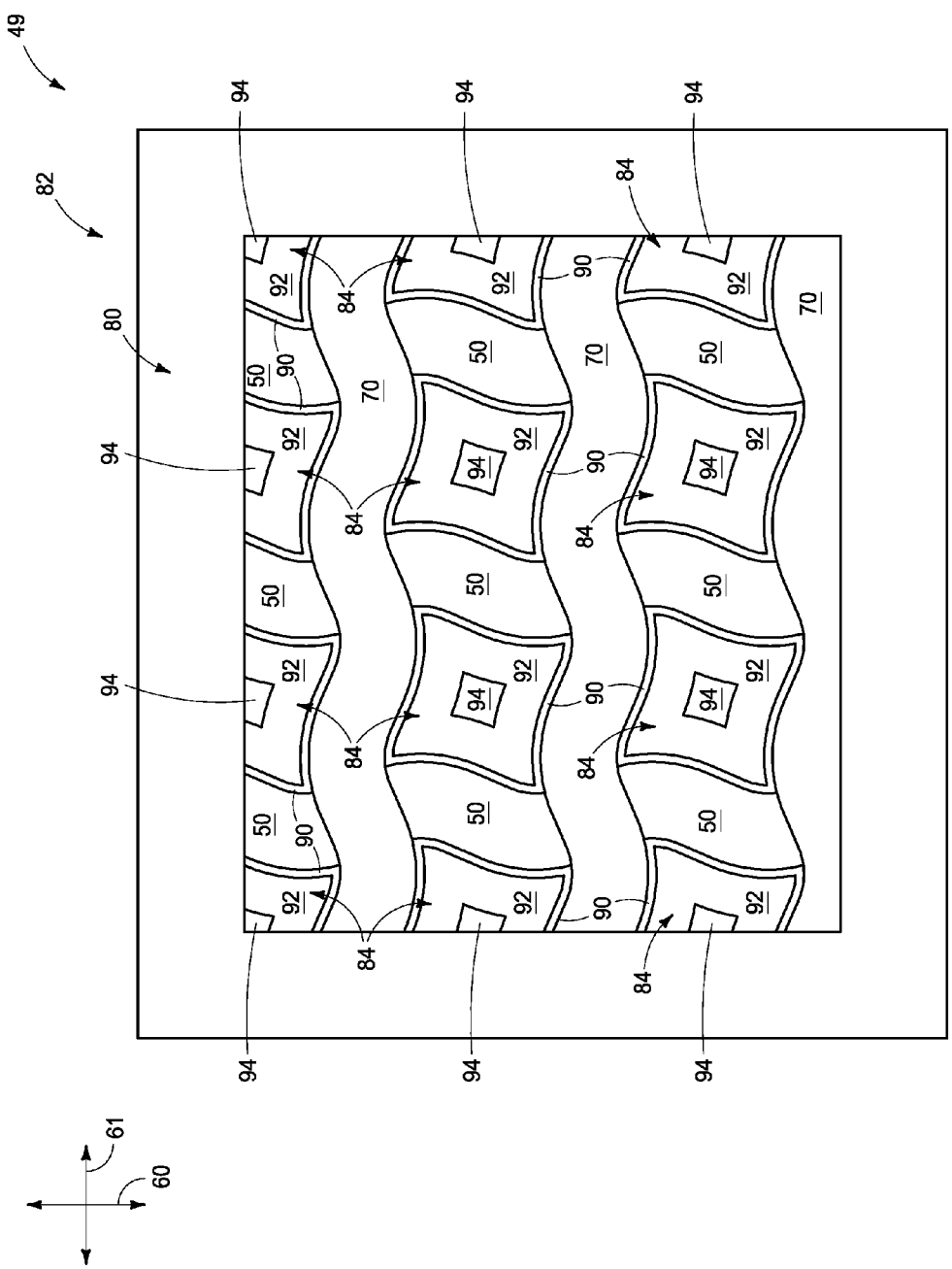

Referring to FIG. 9, liner material 90 is formed within openings 84 and lines sidewalls of the openings. The liner material may be deposited as a layer that extends across bottom surfaces of the openings, sidewalls of the openings, and over the pattern 82. Subsequently, the liner material may be anisotropically etched so that it forms the illustrated annular rings within each opening.

The liner material will be fabricated into plates analogous to the plates 40 of FIG. 4; and accordingly in some embodiments may comprise heater material or storage element material (for instance, phase change material, variable resistance material, etc.).

Electrically insulative material 92 is formed within the openings along the liner material 90. In some embodiments, the material 92 may comprise a same composition as one or more structures of pattern 82 (i.e., wavy lines 50, wavy lines 70 and box 80). For instance, material 92 may comprise, consist essentially of, or consist of silicon nitride. The material 92 may be deposited as a layer and then subjected to anisotropic etching to form the illustrated annular rings within openings 84. Alternatively, material 92 may be deposited as a layer which extends over pattern 82 and within the openings 84, and subsequent planarization (for instance, chemical-mechanical polishing) may be utilized to remove material 92 from across pattern 82 while leaving material 92 to entirely fill the lined openings 84.

The material 92 narrows the openings 84 in the shown embodiment, and such narrowed openings are then filled with a material 94. The material 94 may comprise electrically insulative material; and some embodiments may comprise one or both of silicon nitride and silicon dioxide. The material 94 may be deposited within the openings and across an upper surface of pattern 82, and then may be removed from across pattern 82 utilizing planarization (e.g., chemical-mechanical polishing).

Figure 10:
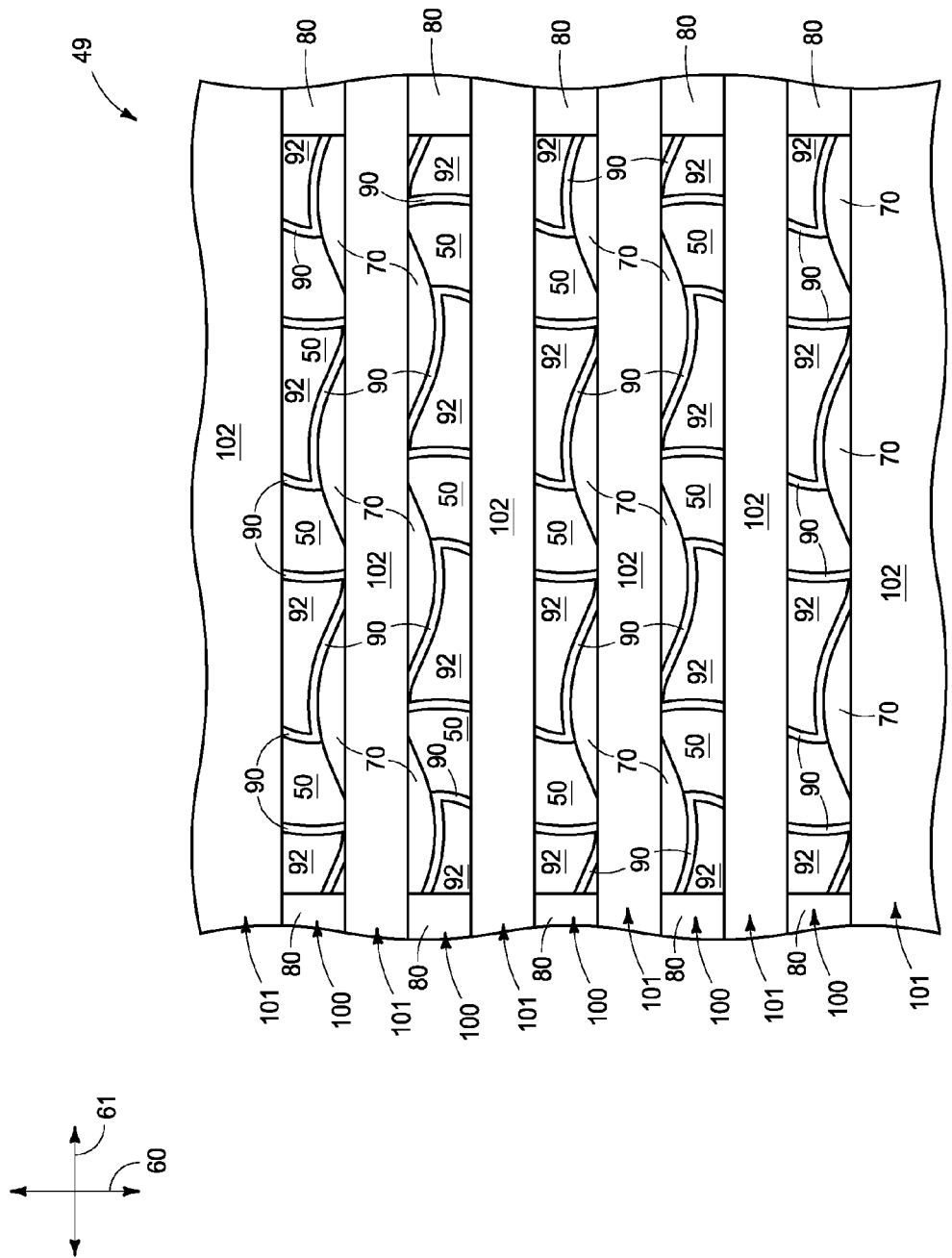

Referring to FIG. 10, the materials 90, 92 and 94 (FIG. 9), together with pattern 82 (FIG. 9), are sliced into strips 100 extending along the row direction of axis 61. Such slicing may be conducted utilizing a patterned mask (not shown) and one or more suitable etches to form trenches 101 extending through pattern 82 and materials 90, 92 and 94. Subsequently, the trenches may be filled with electrically insulative material 102. The material 102 may comprise any suitable composition or combination of compositions; including, for example, one or both of silicon nitride and silicon dioxide. In the shown embodiment, material 102 has been removed from over upper surfaces of materials between the trenches, while leaving the material 102 within trenches 101. This may be accomplished with deposition of material 102 followed by planarization (for instance, CMP).

The strips 100 may overlap the wordlines 57-53 (with such wordlines being described above with reference to FIG. 6).

Referring to FIG. 11, bitline material 110 is formed across an upper surface of construction 49. In embodiments in which liner material 90 (FIG. 10) comprises heater material, chalcogenide (not shown) or other suitable storage element material may be formed across construction 49 prior to bitline material 110, and then the bitline material may be formed over the storage element material. Alternatively, if liner material 90 comprises chalcogenide (or other storage element material suitable for utilization in heaterless cells), then the bitline material 110 may be formed directly against an upper surface of the storage element material. In some embodiments, one or more additional materials (not shown) may be formed between bitline material 110 and the storage element material; with some example materials being buffer materials.

The bitline material 110 may comprise any suitable composition or combination of compositions; and may, for example, comprise, consist essentially of, or consist of one or more metals (for instance, tungsten, aluminum, titanium, etc.) and/or metal-containing compositions (for instance, metal silicide, metal carbide, metal nitride, etc.).

Figure 12:
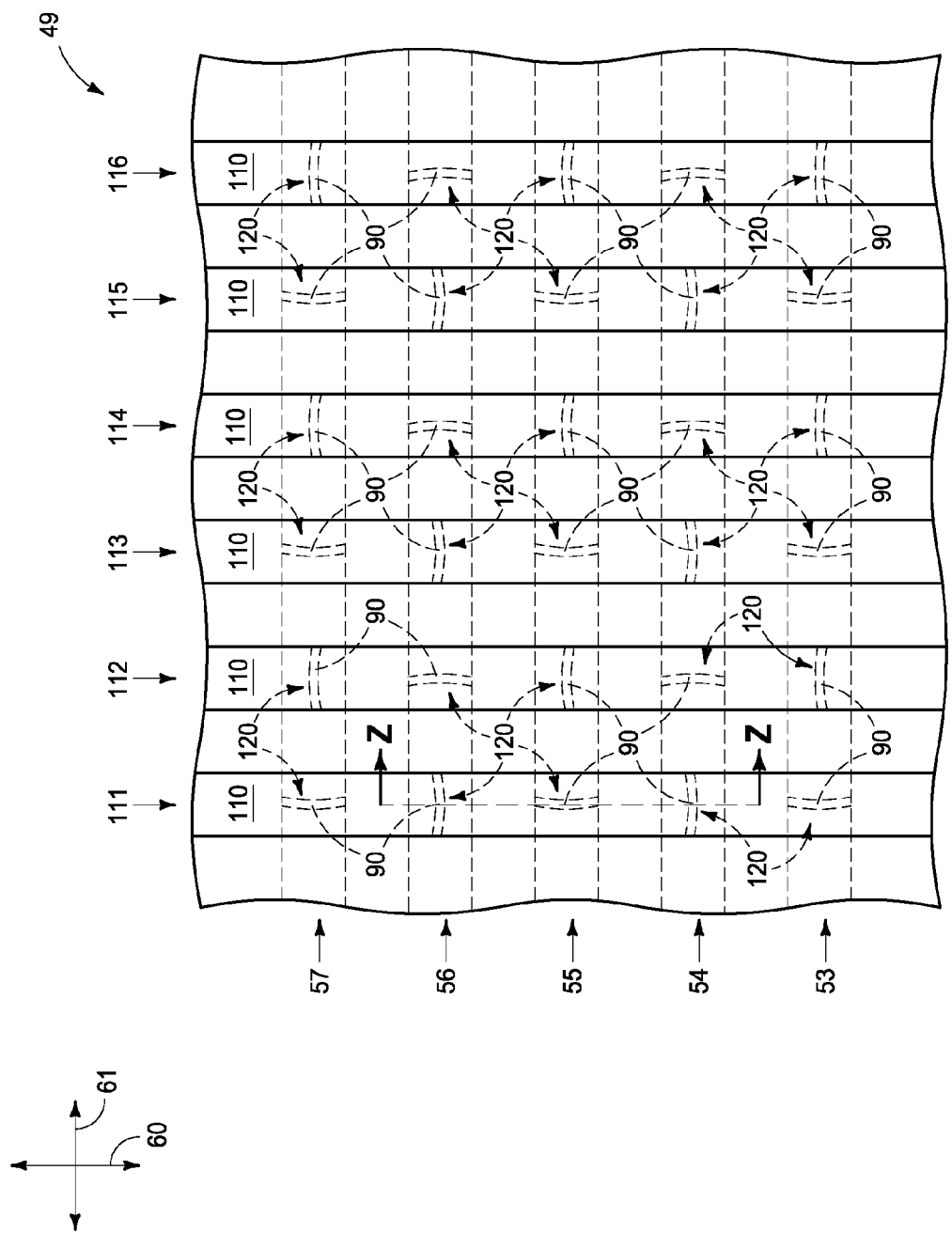

Referring to FIG. 12, the bitline material 110 is patterned into a series of bitlines 111-116 which extend along the column direction of axis 60. The bitlines may be patterned by providing a suitable mask (not shown) over the bitline material and then transferring a pattern from such mask into underlying materials with one or more suitable etches.

In the shown embodiment, the pattern of the bitlines is transferred into underlying liner material 90 (shown in phantom view since it is beneath the bitlines). Such slices material 90 along the column direction 60. The slicing along column direction 60 (FIG. 12) in combination with the slicing of the liner material 90 along the row direction 61 (FIG. 10) patterns the liner material into plates 120 analogous to the plates 40 of FIG. 4. Accordingly, the liner material 90 is patterned into an array of plates; with the plates along individual columns of the array alternating between two orientations which are substantially orthogonal to one another, and with the plates along individual rows of the array also alternating between the two orientations which are substantially orthogonal to one another. Thus, the advantages described above with reference to FIG. 5B may be achieved.

In some embodiments, the plates 120 may correspond to heaters, and chalcogenide (or other suitable storage element material) may be provided between bitlines 111-115 and such heaters to form a plurality of memory cells. In other embodiments, plates 120 may comprise chalcogenide (or other suitable storage element material) of heaterless memory cells. In either event, residual material 92 (FIG. 10) and residual material from lines 50 and 70 (FIG. 10) may remain as spacers along sidewall edges of the plates (example spacers are shown in cross-sectional views of FIGS. 13-15). As discussed above, in some embodiments lines 50 and 70 may comprise silicon nitride, and material 92 may also comprise silicon nitride; and accordingly in some embodiments there may be silicon nitride spacers along opposing surfaces of plates 120. In some embodiments, the plates 120 may be considered to be formed of a first material and the spacers of may be considered to be formed of second material different from the first material.

Figure 13:
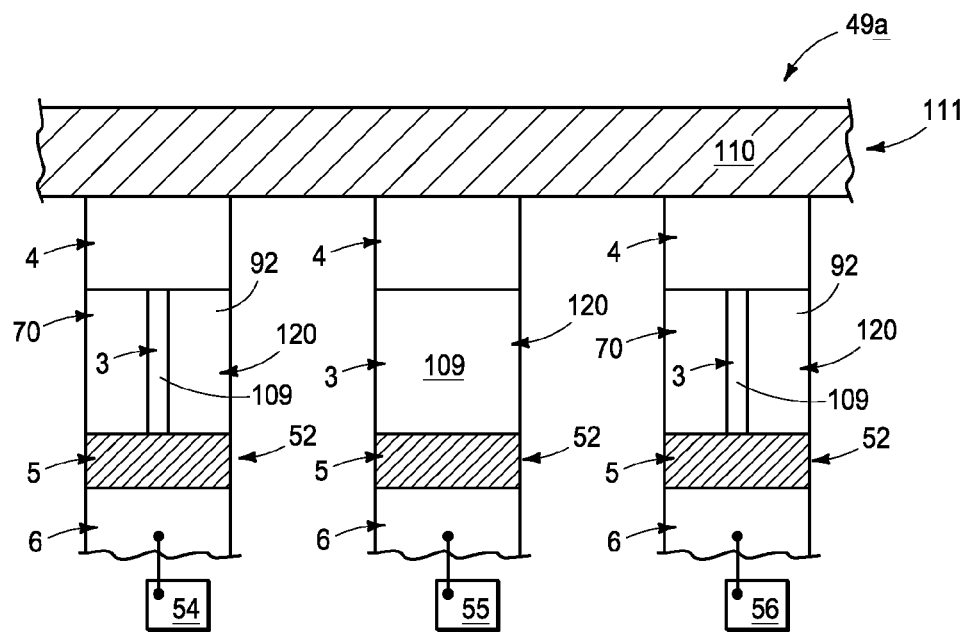
FIGS. 13-15 are diagrammatic cross-sectional side views of portions of example embodiment memory arrays that may be fabricated in accordance with the processing of FIGS. 6-12.
Figure 14:
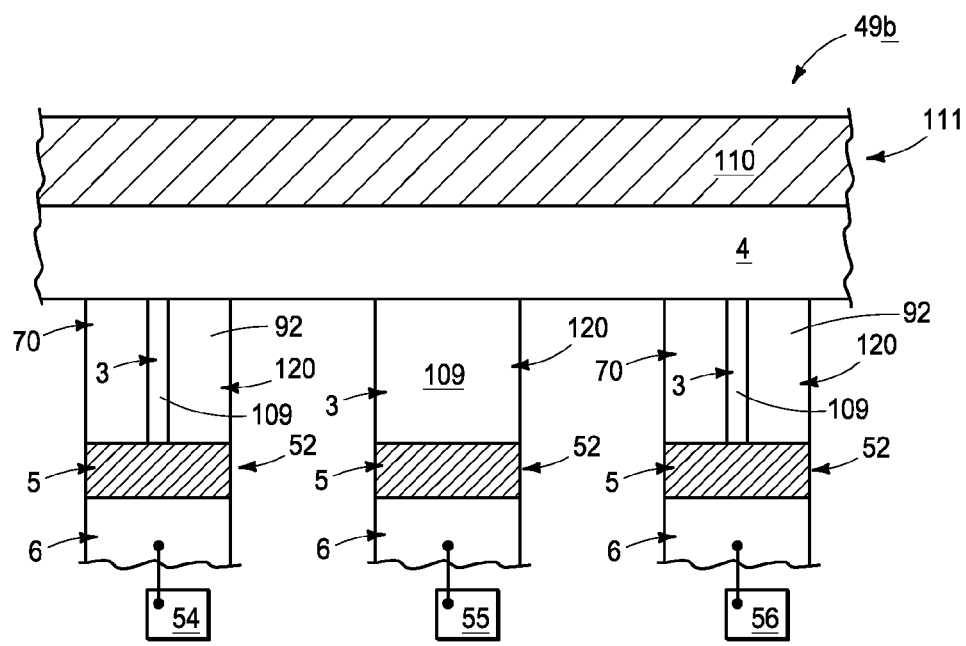
Figure 15:
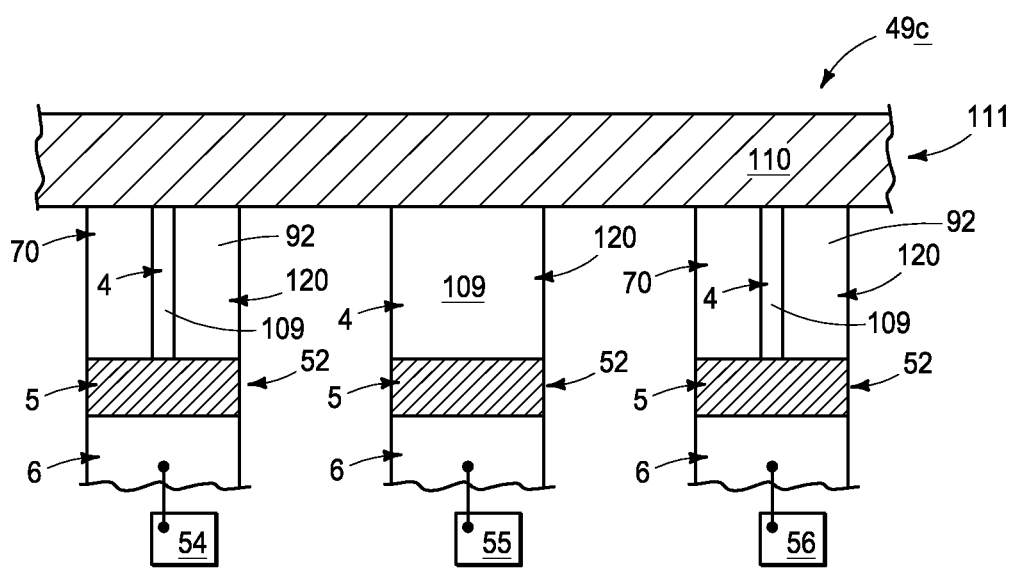

FIGS. 13-15 show cross-sections along the line Z-Z of FIG. 12 relative to example integrated memory constructions. Similar numbering will be used to describe FIGS. 13-15 as is used above in describing FIGS. 1-12.

Referring to FIG. 13, a construction 49a is shown corresponding to an example integrated memory configuration in which plates 120 comprise heaters 3 (i.e., heaters of the type described above with reference to FIG. 1), and accordingly in which liner material 109 is heater material. The illustrated heaters over wordlines 54 and 56 have opposing surfaces against spacer material; with some spacer material being from wavy lines 70 (FIG. 10) and other spacer material being from the material 92 (FIG. 10). The illustrated configuration has storage elements 4 (which may comprise phase change material (such as chalcogenide), or other suitable storage element material) in one-to-one correspondence with the heaters, and has bitline 111 extending across multiple memory cells. The bitline is patterned differently than the storage elements 4, and accordingly the storage element material has been patterned with different processing steps than the bitline. The storage element material may be patterned differently than the bitline by providing the storage element material at a processing step prior to the illustrated processing step of FIG. 11, and then patterning the storage element material into a desired configuration prior to patterning bitline material 110 of FIG. 11.

FIG. 14 shows a construction 49b corresponding to an integrated memory configuration similar to that of FIG. 13, but in which a storage element 4 is patterned the same as the bitline 111. The construction of FIG. 14 may be realized by providing a stack of materials at the processing stage of FIG. 11, with such stack containing storage element material under bitline material 110; and then patterning the stack with a single mask.

FIG. 15 shows a construction 49c corresponding to an integrated memory configuration in which storage elements 4 are patterned into plates 120. The storage element material may comprise any suitable material; and in some embodiments may comprise phase change material (for instance, chalcogenide) incorporated within heaterless PCM devices in the configuration of FIG. 15.

The memory described in the embodiments of FIGS. 4-15 may be referred to as "integrated memory", meaning that the memory may be comprised by a circuit fabricated over and/or within semiconductor material.

The electronic devices and memory arrays discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include integrated memory which comprises an array of repeating plates across a plurality of nodes. The array comprises rows and columns. The plates along individual columns alternate between two orientations which are substantially orthogonal to one another, and the plates along individual rows alternate between the two orientations which are substantially orthogonal to one another.

Some embodiments include a method of forming repeating structures across a plurality of nodes. A pattern is formed which comprises a lattice of intersecting wavy lines and a box surrounding the lattice. The pattern has a plurality of openings extending therethrough. A liner material is along sidewalls of the openings. The liner material and the pattern are sliced along a row direction and a column direction substantially orthogonal to the row direction. Such slicing subdivides the liner material into a plurality of plates. The plates are within an array comprising columns and rows. The plates along individual columns alternate between two orientations which are substantially orthogonal to one another, and the plates along individual rows alternate between the two orientations which are substantially orthogonal to one another.

Some embodiments include a method of forming repeating structures across a plurality of nodes. A first series of wavy lines is formed along a first direction. A second series of wavy lines is formed along a second direction substantially orthogonal to the first direction. The first and second wavy lines overlap to form a lattice. Boxes are formed to surround regions of the lattice and thereby box-in said regions. The boxed-in regions comprise a plurality of openings extending therethrough. A liner material is formed along sidewalls of the openings. The liner material is sliced along a row direction and a substantially orthogonal column direction. Such slicing subdivides the liner material into a plurality of plates. The plates are within an array comprising columns and rows. The plates along individual columns alternate between two orientations which are substantially orthogonal to one another, and the plates along individual rows alternate between the two orientations which are substantially orthogonal to one another.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. Integrated memory comprising an array of repeating plates across a plurality of nodes; the array comprising rows and columns; the plates being narrow rectangular strips when viewed from above; some of the plates being in a first orientation in which the narrow rectangular strips extend along a direction of the rows, and some of the plates being in a second orientation in which the narrow rectangular strips extend along a direction of the columns, the first and second orientations being substantially orthogonal to one another; the plates in the first orientation not contacting the plates in the second orientation; the plates along individual columns alternating between the first and second orientations, and the plates along individual rows alternating between the first and second orientations.

2. The integrated memory of claim 1 wherein the plates comprise heater material.

3. The integrated memory of claim 2 wherein the plates are incorporated into phase change memory cells as heaters.

4. The integrated memory of claim 3 wherein the heater material comprises one or more of WN, TiN, WCN, TiAlN and TiSiN.

5. The integrated memory of claim 3 wherein the phase change memory cells comprise chalcogenide as phase change material; and wherein the chalcogenide of the memory cells extends as lines entirely along the columns.

6. The integrated memory of claim 3 wherein the phase change memory cells comprise chalcogenide as phase change material; and wherein the chalcogenide of the memory cells is configured as segments in one-to-one correspondence with the heaters.

7. The integrated memory of claim 1 wherein the plates comprise storage element material.

8. The integrated memory of claim 1 wherein the plates comprise chalcogenide, and wherein the plates are incorporated into phase change memory cells as phase change material.

9. The integrated memory of claim 8 wherein the chalcogenide comprises germanium, antimony and tellurium.

10. The integrated memory of claim 1 wherein adjacent plates are spaced center-to-edge along the column direction by a same amount as adjacent plates are spaced center-to-edge along the row direction.

* * * * *